United States Patent [19]

Uratsuji

[11] Patent Number: 5,076,798
[45] Date of Patent: Dec. 31, 1991

[54] SHUTTER MECHANISM OF A CONTACT IN AN IC SOCKET

[75] Inventor: Kazumi Uratsuji, Tokyo, Japan

[73] Assignee: Yamaichi Electric Mfg. Co., Ltd., Tokyo, Japan

[21] Appl. No.: 599,393

[22] Filed: Oct. 19, 1990

[30] Foreign Application Priority Data

Oct. 24, 1989 [JP] Japan .............................. 1-124311[U]

[51] Int. Cl.⁵ .................... H01R 13/62; H01R 13/635
[52] U.S. Cl. ...................................... 439/269; 439/68; 439/73; 439/266
[58] Field of Search .................. 439/64, 68, 69, 73, 439/263, 264, 266, 269, 331

[56] References Cited

U.S. PATENT DOCUMENTS

| | | | |
|---|---|---|---|
| 4,691,975 | 9/1987 | Fukunaga et al. | 439/68 |
| 4,801,273 | 1/1989 | Ikeya et al. | 439/269 |
| 4,846,704 | 7/1989 | Ikeya | 439/73 |
| 4,872,850 | 10/1989 | Mogi et al. | 439/266 |
| 4,886,470 | 12/1989 | Billman et al. | 439/266 |
| 5,009,609 | 4/1991 | Matsuoka et al. | 439/264 |

FOREIGN PATENT DOCUMENTS 62-93964  4/1987  Japan .
62-160676 7/1987  Japan .

Primary Examiner—Paula A. Bradley
Attorney, Agent, or Firm—Wenderoth, Lind & Ponack

[57] ABSTRACT

A contact shutter mechanism in an IC socket has a socket body which has a plurality of contacts arranged in such a manner as to be able to contact with terminals of an IC package. A contact shutter member vertically movably disposed on the socket body is adapted to displace, when pushed down, the contacts backward against the resiliency thereof to remove contact between the terminals of the IC package and the contacts and to bring an IC loading portion into a released state. The shutter member has a contact pushing portion adapted to rendering a backward displacement force to the contacts. The contact pushing portion is formed with an inclined surface. The inclined surface is formed at a front-stage pushing portion with a gently inclined surface and at a rear-stage pushing portion with a steeply inclined surface.

9 Claims, 3 Drawing Sheets

SHUTTER MECHANISM OF A CONTACT IN AN IC SOCKET

BACKGROUND OF THE INVENTION

1. Field of the Invention

This invention relates to a contact shutter mechanism in an IC socket, in which a contact included in a socket body is opened and closed by vertical movement of a contact shutter member.

2. Brief Description of the Prior Art

In Japanese Patent Early Laid-open Publication No. Sho 62-160676, a socket body includes a contact shutter member supported in an elevated position by a contact. The contact is displaced backward by pushing down the contact shutter member against the resiliency of the contact to form a non-contacted state relative to an IC contact and to bring an IC loading portion into a released state so that an IC package can be loaded and removed. A pressing portion for exerting a backward displacement force on the contact is formed in a plane at a right angles to the contact, the backward displacement being obtainable by vertically pushing down a projecting end of a rear portion of the contact with the right angle plane.

The contact is displaced forward by its own restoring force and contacted with an upper surface of the terminal of the IC package, supported on a sink-and-float platform of the socket body by the restoring force. At the same time, the contact renders a upward force to the contact pushing portion to hold the contact shutter member in the elevated position so as to be ready for the next non-contact operation.

Since the above-mentioned prior art is designed such that the IC terminal is held down from above of the contact to maintain the IC terminal in the IC socket body, the arrangement for holding the IC package in the IC socket can be simplified. In addition, the contact can be displaced backward simply by pushing down the contact shutter member to cancel the holding of the IC package so that the IC package can be immediately removed or loaded again. Accordingly, it has the advantage in that it can be easily automated by using a robot. Moreover, as a stable contact can be obtained and reliability is excellent, this prior art is widely used.

While the prior art has the above-mentioned advantages, it also has the main shortcoming in that, as the contact is displaced backward in the direction generally perpendicular to the vertical direction by a push-down force in the vertical direction of the contact shutter member, the push-down force is apt to become excessively large.

In a general IC socket of, for example, 40 pins, a push-down force of about 1.6 kg. is required, and because of this reason, the number of IC sockets which can be pushed down at one time by using a robot, and the efficiency in IC measuring operations is lowered. This tendency becomes more and more significant as the number of poles and the density is increased. How to overcome this problem is now a big issue.

In Japanese Patent Early Laid-open Publication No. Sho 62-93964, it is proposed to form the contact pushing portion with an inclined surface in order to cope with the above problem. According to this proposal, although the push-down force can be reduced, the push-down stroke becomes two times or more compared with the prior art, in accordance with the angle of inclination, and not only can the contact not rapidly respond but such a new problem as insufficient dilation results.

The present invention has been accomplished in order to obviate the above-mentioned problems.

SUMMARY OF THE INVENTION

It is therefore an object of the present invention to provide a contact shutter mechanism in an IC socket which is capable of simultaneously solving the problem in the first-mentioned prior art document in that the push-down force becomes excessively large and the prior art reference in the second-mentioned problem in that the push-down stroke becomes excessively large, and in which the opening operation, i.e., the backward displacement of the contact, can be performed by a limited push-down stroke and by a reduced push-down force.

In order to achieve the above-mentioned problems, there is provided a contact shutter mechanism in an IC socket comprising a socket body including a plurality of contacts arranged in such a manner as to be able to contact with terminals of an IC package. A contact shutter member is vertically movably disposed on the socket body and adapted to displace, when pushed down, the contacts backward against the resiliency thereof out of contact with the terminals of the IC package and to bring an IC loading portion into a released state. The shutter member includes a contact pushing portion adapted to render a backward displacement force to the contacts. The contact pushing portion is formed with an inclined surface, the inclined surface being formed at a front-stage pushing portion with a gently inclined surface and at a rear-stage pushing portion with a steeply inclined surface. Both the front-stage gently inclined surface and the rear-stage steeply inclined surface may be formed as linear surfaces. The front-stage gently inclined surface may also be formed as an arcuate surface.

As mentioned above, the contacts, formed of a resilient material, are weak in resiliency at an early stage of resilient displacement, and therefore, can be displaced with a small force, while the resiliency becomes stronger with the progress of displacement, and therefore a large force is required to displace the contacts. The present invention utilizes this characteristic. The present invention is designed such that the gently inclined surface acts on the contacts in the early stage where the resilient displacement can be performed with a small displacement force, thereby to obtain a larger backward displacement amount, while the steeply inclined surface acts on the contacts to abruptly reduce the push-down force in a region where the displacement force is thereafter increased, to thereby achieve a target displacement amount.

By this the push-down force of the contact shutter member as a whole can be reduced, and a required backward displacement amount can be obtained with a limited push-down stroke.

The novel features which are considered as characteristic for the present invention are set forth in particular in the appended claims. The present invention itself, however, together with additional objects and advantages thereof, will be best understood from the following description of specific embodiments when read in connection with the accompanying drawings.

DETAILED DESCRIPTION OF THE EMBODIMENT

Embodiments of the present invention will now be described in detail with reference to FIGS. 1 through 5 of the accompanying drawings.

A socket body 1 has a plurality of contacts 4 which are arranged to be able to contact with a plurality of terminals 3 of an IC package 2.

Figure 3:
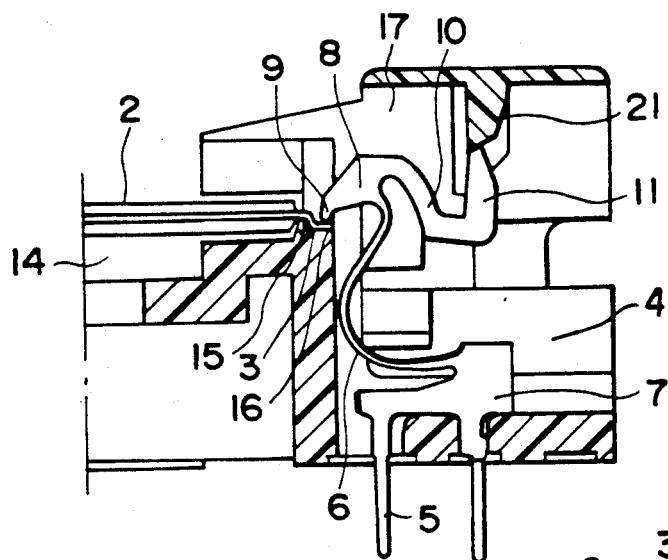
FIG. 3 is a sectional view of a portion of the IC socket with an IC package already loaded therein.

The terminals 3, of the IC package 2 as shown in FIG. 3, project sidewards in parallel with each other from opposite sides of the IC package 2. Leading ends of the terminals 3 are bent twice to form a generally horizontal shape.

Figure 2:
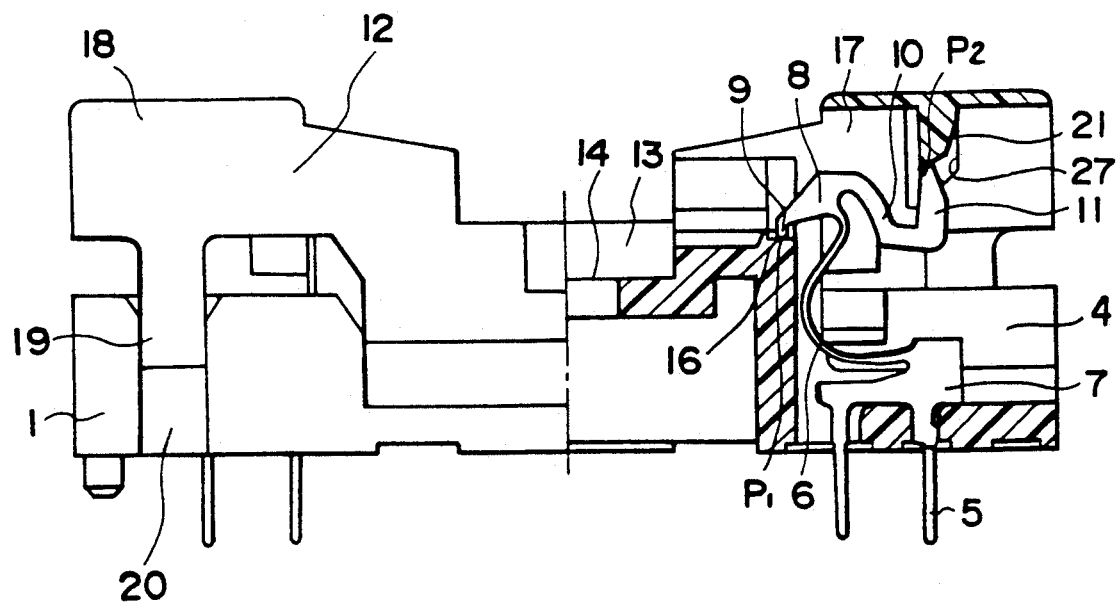
FIG. 2 is a side view, partly in section, of FIG. 1.

Each of the contacts 4, as shown in FIG. 2, has a male terminal 5 projecting downward from a stationary end 7 implanted into the socket body 1, and a curved spring piece 6 is connected to an upper portion of the stationary end 7. The spring piece 6 projects forward (toward the IC package 2 side), and an upper end of the curved spring piece 6 is connected with a contact element 8. The contact element 8 projects in the projecting direction (forward) of the curved spring piece 6 and a front end thereof is formed into a contacting projection 9.

Also, a cantilever arm 10 extends backward from an upper end of the contact, that is, the contacting element 8. The cantilever arm 10 is connected at one end thereof to the contacting element 8. The other end of the cantilever arm 10 is a free end, from which a pressure receiving portion 11 projects upward, the pressure receiving portion 11 being opened and closed by a contact shutter member, as will be described hereinafter.

An upper end of a projecting piece extending upward to form the pressure receiving portion 11 is established as a pressure point $P_2$, pushed by a contact shutter member. A lower end of the contacting projection 9 of the contacting element 8 is established as a contacting point $P_1$, contacted with the terminal 3, the pressure point $P_2$ being located in a position higher than a horizontal line passing the contacting point $P_1$.

The illustrated cantilever arm 10 extends downward from the contacting element 8 past the level of the contacting point $P_1$, and is then bent into a hook shape to form the upwardly directed projecting piece or pressure receiving portion 11.

The contact 4 contacts, under pressure, an upper surface of a front end portion of the terminal 3, supported by a terminal supporting seat 16 formed at a bottom surface of an IC package loading portion 14 of the socket body 1, from above at an angle with the contacting projection 9 of the contacting element 8. As a consequence, the terminal 3 is sandwiched, under pressure, between the stationary supporting seat 16 and the contact 4, thereby holding the IC package 2.

The IC package may be designed such that the terminal supporting seat 16 serves as an electrically contacting surface relative to the stationary terminal, and the stationary terminal forming the contacting surface is provided to the contact 4, so that the contact 4 can be contacted with upper and lower surfaces of the IC terminal.

The numeral 12 denotes a contact shutter member for exerting a downward force on the pressure receiving portion 11 of the contact 4. The contact shutter member 12 is vertically movably mounted on the socket body 1.

Figure 1:
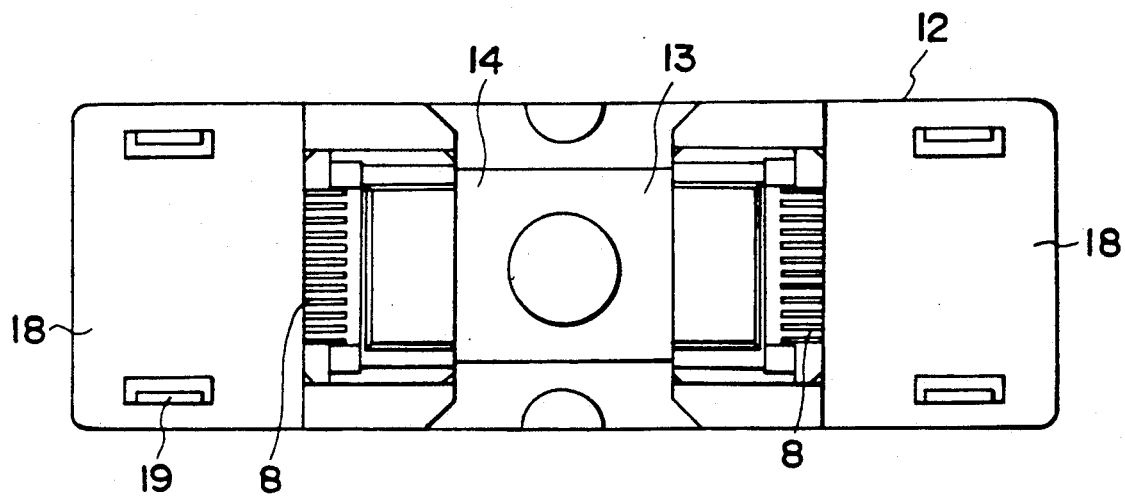
FIG. 1 is a plan view showing an IC socket according to one embodiment of the present invention.

The contact shutter member 12, as shown in FIGS. 1 and 2, has an IC accommodation window 13 at a central portion thereof. The IC loading portion 14 of the socket body 1 is formed immediately under the IC accommodation window 13. The IC loading portion 14 has a projection 15 for supporting a substrate portion of the terminal 3 of the IC package 2, so that side surfaces of the IC package 2 body or the bent stage portion of the terminal 3 can be regulated to position the IC package 2 correctly. The front end portion of the terminal 3 is then supported by the terminal supporting seat 16 disposed outside the projection 15 so as to be held in a predetermined place.

The contacts 4 are arranged, side by side, along the opposite sides of the IC loading portion 14. The contacting elements 8 of the contacts 4 are accommodated in an open portion 17 formed sidewards of the terminal supporting seat 16, with the contacting projections 9 abutted against the outer surface of the terminal supporting seat 16 and held in a state accumulating a resilient force, i.e., in a preloaded state. As a result, the terminal supporting seat 16 pushes on the contacting point $P_1$ against the resiliency of the curved spring piece 6.

The contact shutter member 12 includes a pair of push-down operation portions 18 disposed at both outer sides of the IC accommodation window 13. Engaging fingers 19 extend downward from the opposite side walls of the push-down operation portion 18, and the engaging fingers 19 are engaged in guide grooves 20 formed in the opposite side walls of the socket body 1 so that the contact shutter member 12 can be moved in the vertical direction along the guide grooves 20. Engaging claws formed on the front ends of the engaging fingers 19 are brought into engagement with step portions formed in the upper ends of the guide grooves 20 when the contact shutter member 12 is moved upward by a predetermined amount, thereby establishing an upper dead point of the contact shutter member 12. The contact shutter member 12 is pushed up by the pressure receiving portion 11 of the contacts and supported in an upper position, whereat the contact shutter member 12 is in a push-down waiting state.

Furthermore, partition walls 27, to be interposed between the pressure receiving portions 11 of the respective contacts 4, project downward from the push-down operation portions 18. A pushing portion 21 for exerting a pushing force on the pressure receiving portion of the contact 4 is formed in a valley portion between the adjacent partition walls 27.

Figure 4:
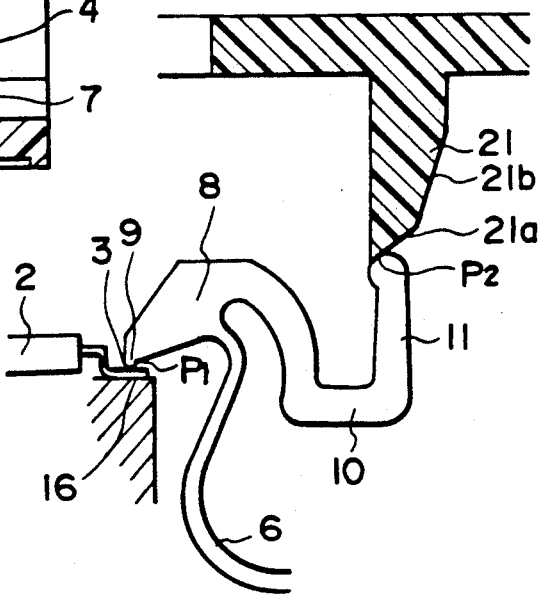
FIGS. 4(A), 4(B) and 4(C) are sectional views in sequential order for illustrating a procedure for displacing the contacts backward by pushing down a contact shutter member, FIG. 4(A) showing one state in which a front-stage gently inclined surface acts to start a push-down operation and the contacts begin to separate away from IC terminals, FIG. 4(B) showing another state in which the push-down operation is further progressed and a rear-stage steeply inclined surface acts to displace the contacts backward, and FIG. 4(C) showing a further state in which the push-down operation is completed and the backward displacement is finished.
Figure 4:
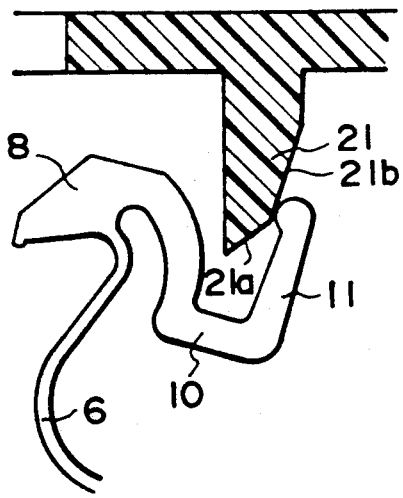
Figure 4:
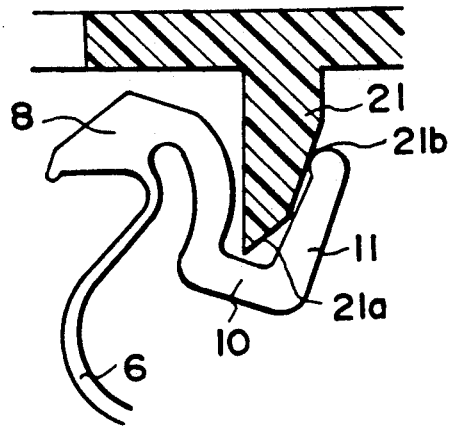
Figure 5A:
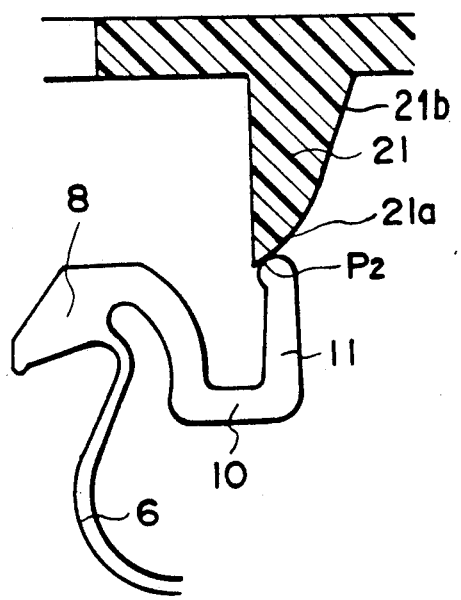
FIGS. 5(A), 5(B) and 5(C) are sectional views showing another embodiment in such a manner as to correspond with the procedure of FIGS. 4(A), 4(B) and 4(C), in which the front-stage gently inclined surface is formed in an arcuate surface.
Figure 5B:
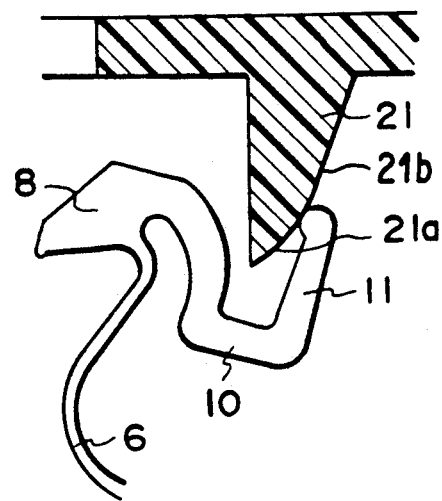
Figure 5C:
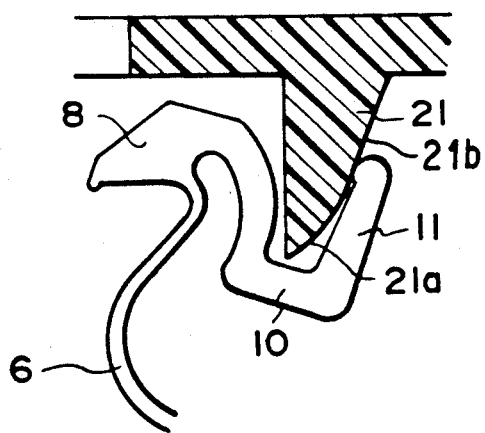
Figure 6:
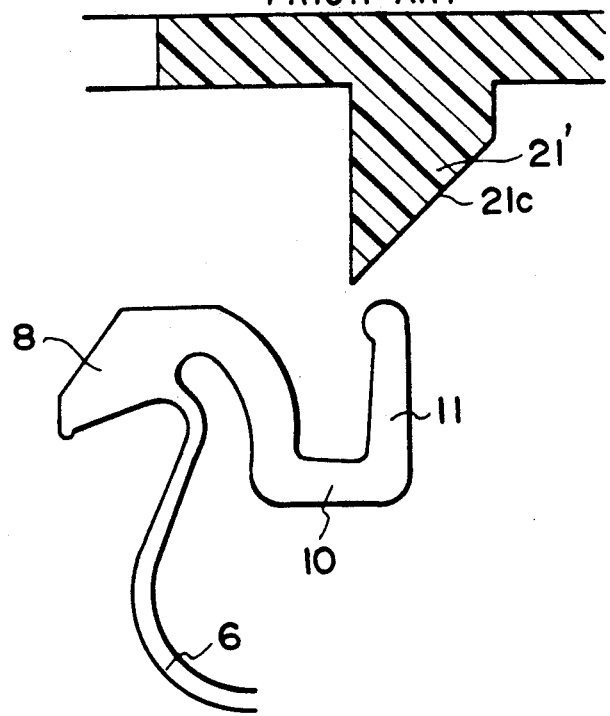
FIG. 6 is a sectional view of a conventional contact pressing portion of one stage inclination, used, according to a further embodiment of the present invention, together with the contact pressing portion having a two stage inclination.

The pushing portion 21 is formed with an inclined surface directed downward, the inclined surface having a rising gradient toward the rear of the contact. Furthermore, the inclined surface is formed with a gently inclined surface 21a at a front stage pushing portion and with a steeply inclined surface 21b at a rear stage pushing portion. FIG. 4 (A-C) shows one example in which both the front stage gently inclined surface 21a and the rear stage steeply inclined surface 21b are formed as linear surfaces, i.e., the slopes of the surfaces are constant, and FIG. 5 (A-C) shows another example in which the front stage gently inclined surface is formed as an arcuate surface.

As shown in FIGS. 4(A), 4(B) and 4(C), and 5(A), 5(B) and 5(C), when a push-down force is applied to the push-down operation portion 18 in the state where the contact shutter member 12 is in the waiting position and the pushing portion 21 is moved downward in the vertical direction, the pressure point $P_2$ of the pressure receiving portion 11 of the contact 4 slides down the front stage gently inclined surface 21a to the rear stage steeply inclined surface 21b. A larger initial amount of backward displacement of the contact 4 can be obtained with a shorter push-down stroke by the push-down function of the front stage gently inclined surface 21a, and the remaining amount of backward displacement can be obtained with a reduced push-down force by the push-down function of the rear stage steeply inclined surface 21b, thereby achieving a target backward displacement amount.

That is, when a pushing force is applied to the pressure receiving portion 11, the front stage gently inclined surface 21a acts on the pressure point $P_2$ to abruptly backwardly displace the curved spring piece 6 against the resiliency of thereof, and in the meantime the cantilever arm is displaced to achieve an initial backward displacement along an orbit starting from an upper position (starting point for applying the pushing force) past the upper dead point on a circle about the contacting point $P_1$ toward the back of the dead point on the same side. Furthermore, the rear stage steeply inclined surface 21b acts thereon to achieve a target displacement amount with a reduced force, thereby surely separating the contacting element 3 and from the terminal 8 moving it into a non-contact state and bringing the IC loading portion 14 into a released state. Preferably the cantilever arm 10 and the contacting element 8 are rigid relative to the pushing force.

By utilizing the characteristic of the contact 4, formed of resilient material, that the contact 4 is weak in resiliency at an initial stage, and thus able to be displaced with a comparatively small force, and the resiliency is increased with the progress of the displacement, the present invention is designed such that a large amount of backward displacement is obtained by using the front stage gently inclined surface 21a on the contact 4 in the initial stage where the resilient displacement can be obtained by a comparatively small displacement force, and the push-down force is abruptly reduced by using the rear stage steeply inclined surface 21b on the contact 4 to perform the remaining displacement in the latter half stage where the resilient force is increased, thereby achieving the target displacement amount.

By this, the push-down force of the contact shutter member 12 is reduced as a whole, and the required backward displacement amount is obtained with a limited push-down stroke.

In this way, the contacting element 8 is held in a separated position so as not to interfere with the IC package 2, and the IC loading portion 14 including the terminal supporting seat 16 is brought to a released state. In the foregoing state, the IC package 2 is removed from or loaded on the IC loading portion 14 through the IC accommodation window 13. When the push-down force on the push-down operation portion 18 of the contact shutter member 12 is removed, the contact shutter member 12 is pushed upward by the restoring force of the curved spring 6 and the cantilever arm 10 of the contact 4. The contact shutter member 12 is held in a position raised by a certain amount and waits for the next push-down operation again. On the other hand, the contact elements 8 of the contacts 4 are forwardly displaced by the restoring force and brought into contact, under a certain contact pressure, with the upper surfaces of the front end portions of the terminals 3 supported by the terminal supporting seat 16 from above at an angle. This contacting pressure is the sum of the resilient force preliminarily accumulated by the push-up force of the terminal supporting seat 16 and the resilient force generated in such a manner as to correspond to the thickness of the terminals 3.

Due to the foregoing arrangement, the IC package 2 is sandwiched between the terminal supporting seat 16 and the contacting projection 9 of the contacting element 8 and held by the socket body 1.

When the push-down operation portion 18 of the contact shutter member 12 is further pushed down again from the foregoing state, the contact 4 is displaced backward as in the above-mentioned case to remove the contact with the IC package 2 and is brought to a non-interference state. In that state, the IC package 2 is loaded in and removed from the IC socket.

The push-down operation of the contact shutter member 12 can be performed by vertical motion of manipulation of a robot.

In the above-mentioned embodiments, the contacts 4 are arranged, side by side, along the opposite two sides of the IC loading portion 14 of the socket body 1. However, the present invention is likewise applicable to a case where the contacts 4 are along the four sides of the IC loading portion 14 of the socket body 1. In that case, the push-down operation portions 18 of the contact shutter members 12 can be disposed at four places around the IC accommodation window in such a manner as to correspond to the contacts 4.

As a preferred embodiment, it may be designed such that the pushing portions 21 each having the front stage gently inclined surface 21a and the rear stage steeply inclined surface 21b are disposed in such a manner as to correspond to each of the contacts 4, or the pushing portions 21 each having the two stage inclined surface are disposed in such a manner as to correspond to a limited number of contacts 4 among the total contacts 4. In the latter case, conventional pushing portions 21', each having one stage inclined surfaces 21c, are employed relative to other contacts 4 as shown in FIG.

4(A–C), so that the pushing portion 21 of a two stage inclined surface and the pushing portion 21′ of a one stage inclined surface are used together.

According to the present invention, by utilizing the characteristic of the contacts, formed of resilient material, that the contacts are is weak in resiliency at an initial stage, and thus able to be displaced with a comparatively small force, and the resiliency is increased with the progress of the displacement, a large amount of backward displacement is obtained by using the front stage gently inclined surface 21a on the contact 4 at the initial stage where the resilient displacement can be obtained by a comparatively small displacement force, and the push-down force is abruptly reduced by using the rear stage steeply inclined surface 21b on the contact 4 to perform the remaining displacement at the latter half stage where the resilient force is increased, thereby achieving the target displacement amount. By this the push-down force of the contact shutter member can be reduced as a whole and a required amount of backward displacement can be obtained with a limited push-down stroke.

In this way, the present invention simultaneously solves the problem that the push-down force becomes excessively large as in the first prior art document and the problem that the push-down stroke becomes excessively large as in the second prior art document, and achieves the object that the contacts can be displaced backward with a limited push-down stroke and with a reduced push-down force. As a consequence, the present invention can fully enjoy the above-mentioned advantages of the IC socket.

Preferred embodiments of the present invention have been disclosed for illustrative purposes. Many variations and modifications of the disclosed embodiments are believed to be within the spirit of the present invention. The following claims are intended to cover inventive portions of the disclosed embodiments and variations and modifications believed to be within the spirit of the inventive portions.

What is claimed is:

1. A contact shutter mechanism in an IC socket, comprising:
   a socket body;
   a plurality of contacts disposed in said socket body for contact with terminals of an IC package, each said contact having a pressure receiving portion, and each said contact being resiliently biased toward a contact position; and
   a contact shutter member vertically movably mounted on said socket body for displacing said contacts to a non-contact position upon downward movement, said contact shutter member having a contact pushing portion for pushing on said pressure receiving portion of a said contact to move said contact against its resiliency to the non-contact position, said contact pushing portion having an inclined surface, and said inclined surface comprising a front-stage pushing portion having a gently inclined surface and a rear-stage pushing portion having a steeply inclined surface.

2. The contact shutter mechanism of claim 1, wherein both said gently inclined surface and said steeply inclined surface are linear.

3. The contact shutter mechanism of claim 1, wherein said gently inclined surface is arcuate.

4. The contact shutter mechanism of claim 1, wherein said gently inclined surface rests on said pressure receiving portion of said contact when said contact is in the contact position, and said steeply inclined surface is in contact with said pressure receiving portion when said contact is in the non-contact position.

5. A contact shutter mechanism in an IC socket, comprising:
   a socket body;
   a plurality of contacts disposed in said socket body for contact with terminals of an IC package, each said contact having a pressure receiving portion, and each said contact being resiliently biased toward a contact position; and
   a contact shutter member vertically movably mounted on said socket body, said contact shutter member comprising a contact pushing means for contacting said pressure receiving portion of a said contact and initially displacing said contact toward a non-contact position at a relatively rapid rate and subsequently displacing said contact toward the non-contact position at a slower rate upon downward movement of said contact shutter member, said contact pushing means comprising an inclined surface having a front-stage pushing portion with a gently inclined surface displacing said contact at the relatively rapid rate and a rear-stage pushing portion having a steeply inclined surface displacing said contact at the slower rate.

6. The contact shutter mechanism of claim 5, wherein both said gently inclined surface and said steeply inclined surface are linear.

7. The contact shutter mechanism of claim 5, wherein said gently inclined surface is arcuate.

8. The contact shutter mechanism of claim 5, wherein said gently inclined surface rests on said pressure receiving portion of said contact when said contact is in the contact position, and said steeply inclined surface is in contact with said pressure receiving portion when said contact is in the non-contact position.

9. The contact shutter mechanism of claim 5, wherein said contact pushing means comprises a single member integral with said contact shutter member having said gently and steeply inclined surfaces on one side thereof.

* * * * *